United States Patent
Dean et al.

(10) Patent No.: US 9,158,349 B2
(45) Date of Patent: Oct. 13, 2015

(54) SYSTEM AND METHOD FOR HEAT DISSIPATION

(71) Applicant: SanDisk Enterprise IP LLC, Milpitas, CA (US)

(72) Inventors: David Dean, Litchfield Park, AZ (US); Robert Ellis, Phoenix, AZ (US)

(73) Assignee: SanDisk Enterprise IP LLC, Milpitas, CA (US)

( * ) Notice: Subject to any disclaimer, the term of this patent is extended or adjusted under 35 U.S.C. 154(b) by 119 days.

(21) Appl. No.: 14/135,223

(22) Filed: Dec. 19, 2013

(65) Prior Publication Data

US 2015/0098176 A1    Apr. 9, 2015

Related U.S. Application Data

(60) Provisional application No. 61/887,299, filed on Oct. 4, 2013.

(51) Int. Cl.
*G06F 1/16* (2006.01)
*G06F 1/20* (2006.01)
(Continued)

(52) U.S. Cl.
CPC *G06F 1/20* (2013.01); *G06F 1/185* (2013.01); *H01L 23/34* (2013.01); *H05K 1/0209* (2013.01);
(Continued)

(58) Field of Classification Search
USPC .......... 345/179, 1.1, 211, 697, 173, 212, 207; 361/719, 749, 699, 679.37, 679.15, 361/679.5, 679.47, 679.31, 679.54, 679.48, 361/679.6, 679.46, 679.49, 679.58, 679.17, 361/679.32, 679.09, 679.33, 679.43, 361/679.06; 362/294, 547, 235, 147, 540, 362/382, 249.06, 244; 165/104.33, 104.29, 165/104.21, 80.1, 185, 67, 104.28, 122, 165/80.3; 439/487, 66, 71, 526, 910, 73, 439/638, 344, 196, 557; 455/562.1, 561, 455/230, 252.1, 456.1, 77, 434, 196, 557
See application file for complete search history.

(56) References Cited

U.S. PATENT DOCUMENTS 4,839,587 A    6/1989 Flatley et al.
4,916,652 A    4/1990 Schwarz et al.
(Continued)

FOREIGN PATENT DOCUMENTS

CN    201 655 782    11/2010
CN    102 446 873    5/2012
(Continued)

OTHER PUBLICATIONS

International Search Report and Written Opinion dated Dec. 16, 2014, received in International Patent Application No. PCT/US2014/059114, which corresponds to U.S. Appl. No. 14/135,223, 9 pages (Dean).
(Continued)

*Primary Examiner* — Hung Duong
(74) *Attorney, Agent, or Firm* — Morgan, Lewis & Bockius LLP

(57) ABSTRACT

The various implementations described herein include systems, methods and/or devices used to manage heat flow for dissipating heat generated by electronic components in an electronic system (e.g., a memory system that includes closely spaced memory modules). In one embodiment, heat sinks are disposed on front sides of a first module and a second module in the electronic system, and at least one heat sink in the second module is disposed between at least two heat sinks in the first module. In some embodiments, the number of heat sinks and/or a subset of geometric parameters for the locations, sizes and shapes of the heat sinks are configured for the purpose of disturbing and mixing air flow that passes an air gap between the front sides of the first and second modules.

22 Claims, 6 Drawing Sheets

(A-A' Cross-section View)

(51) Int. Cl.

| | | |
|---|---|---|
| *H05K 13/00* | (2006.01) | |
| *G06F 1/18* | (2006.01) | |
| *H01L 23/34* | (2006.01) | |
| *H05K 1/02* | (2006.01) | |
| *G11C 5/04* | (2006.01) | |
| *H05K 3/36* | (2006.01) | |

(52) U.S. Cl.
CPC .............. *H05K 13/0023* (2013.01); *G11C 5/04* (2013.01); *H05K 3/366* (2013.01); *H05K 2201/066* (2013.01); *H05K 2201/10159* (2013.01)

(56) References Cited

U.S. PATENT DOCUMENTS

| | | | |
|---|---|---|---|
| 5,210,680 | A | 5/1993 | Scheibler |
| 5,270,979 | A | 12/1993 | Harari et al. |
| 5,519,847 | A | 5/1996 | Fandrich et al. |
| 5,530,705 | A | 6/1996 | Malone, Sr. |
| 5,537,555 | A | 7/1996 | Landry et al. |
| 5,551,003 | A | 8/1996 | Mattson et al. |
| 5,628,031 | A | 5/1997 | Kikinis et al. |
| 5,657,332 | A | 8/1997 | Auclair et al. |
| 5,666,114 | A | 9/1997 | Brodie et al. |
| 5,708,849 | A | 1/1998 | Coke et al. |
| 5,828,549 | A | 10/1998 | Gandre et al. |
| 5,923,532 | A | 7/1999 | Nedved |
| 5,943,692 | A | 8/1999 | Marberg et al. |
| 5,946,190 | A | 8/1999 | Patel et al. |
| 5,982,664 | A | 11/1999 | Watanabe |
| 6,000,006 | A | 12/1999 | Bruce et al. |
| 6,008,987 | A | 12/1999 | Gale et al. |
| 6,009,938 | A | 1/2000 | Smith et al. |
| 6,016,560 | A | 1/2000 | Wada et al. |
| 6,018,304 | A | 1/2000 | Bessios |
| 6,061,245 | A | 5/2000 | Ingraham et al. |
| 6,070,074 | A | 5/2000 | Perahia et al. |
| 6,138,261 | A | 10/2000 | Wilcoxson et al. |
| 6,182,264 | B1 | 1/2001 | Ott |
| 6,192,092 | B1 | 2/2001 | Dizon et al. |
| 6,295,592 | B1 | 9/2001 | Jeddeloh |
| 6,311,263 | B1 | 10/2001 | Barlow et al. |
| 6,335,862 | B1 | 1/2002 | Koya |
| 6,442,076 | B1 | 8/2002 | Roohparvar |
| 6,449,625 | B1 | 9/2002 | Wang |
| 6,484,224 | B1 | 11/2002 | Robins et al. |
| 6,516,437 | B1 | 2/2003 | Van Stralen et al. |
| 6,618,249 | B2 | 9/2003 | Fairchild |
| 6,621,705 | B1 | 9/2003 | Ballenger et al. |
| 6,678,788 | B1 | 1/2004 | O'Connell |
| 6,757,768 | B1 | 6/2004 | Potter et al. |
| 6,762,942 | B1 * | 7/2004 | Smith ........................... 361/749 |
| 6,775,792 | B2 | 8/2004 | Ulrich et al. |
| 6,810,440 | B2 | 10/2004 | Micalizzi, Jr. et al. |
| 6,836,808 | B2 | 12/2004 | Bunce et al. |
| 6,836,815 | B1 | 12/2004 | Purcell et al. |
| 6,842,436 | B2 | 1/2005 | Moeller |
| 6,871,257 | B2 | 3/2005 | Conley et al. |
| 6,888,725 | B2 * | 5/2005 | Kubo et al. ................... 361/719 |
| 6,895,464 | B2 | 5/2005 | Chow et al. |
| 6,978,343 | B1 | 12/2005 | Ichiriu |
| 6,980,985 | B1 | 12/2005 | Amer-Yahia et al. |
| 6,981,205 | B2 | 12/2005 | Fukushima et al. |
| 6,988,171 | B2 | 1/2006 | Beardsley et al. |
| 7,020,017 | B2 | 3/2006 | Chen et al. |
| 7,032,123 | B2 | 4/2006 | Kane et al. |
| 7,043,505 | B1 | 5/2006 | Teague et al. |
| 7,079,972 | B1 | 7/2006 | Wood et al. |
| 7,100,002 | B2 | 8/2006 | Shrader |
| 7,111,293 | B1 | 9/2006 | Hersh et al. |
| 7,162,678 | B2 | 1/2007 | Saliba |
| 7,173,852 | B2 | 2/2007 | Gorobets et al. |
| 7,184,446 | B2 | 2/2007 | Rashid et al. |
| 7,233,501 | B1 | 6/2007 | Ingalz |
| 7,328,377 | B1 | 2/2008 | Lewis et al. |
| 7,516,292 | B2 | 4/2009 | Kimura et al. |
| 7,523,157 | B2 | 4/2009 | Aguilar, Jr. et al. |
| 7,527,466 | B2 | 5/2009 | Simmons |
| 7,529,466 | B2 | 5/2009 | Takahashi |
| 7,571,277 | B2 | 8/2009 | Mizushima |
| 7,574,554 | B2 | 8/2009 | Tanaka et al. |
| 7,596,643 | B2 | 9/2009 | Merry, Jr. et al. |
| 7,681,106 | B2 | 3/2010 | Jarrar et al. |
| 7,685,494 | B1 | 3/2010 | Varnica et al. |
| 7,707,481 | B2 | 4/2010 | Kirschner et al. |
| 7,761,655 | B2 | 7/2010 | Mizushima et al. |
| 7,774,390 | B2 | 8/2010 | Shin |
| 7,840,762 | B2 | 11/2010 | Oh et al. |
| 7,870,326 | B2 | 1/2011 | Shin et al. |
| 7,890,818 | B2 | 2/2011 | Kong et al. |
| 7,913,022 | B1 | 3/2011 | Baxter |
| 7,925,960 | B2 | 4/2011 | Ho et al. |
| 7,934,052 | B2 | 4/2011 | Prins et al. |
| 7,954,041 | B2 | 5/2011 | Hong et al. |
| 7,971,112 | B2 | 6/2011 | Murata |
| 7,974,368 | B2 | 7/2011 | Shieh et al. |
| 7,978,516 | B2 | 7/2011 | Olbrich et al. |
| 7,996,642 | B1 | 8/2011 | Smith |
| 8,006,161 | B2 | 8/2011 | Lestable et al. |
| 8,032,724 | B1 | 10/2011 | Smith |
| 8,069,390 | B2 | 11/2011 | Lin |
| 8,190,967 | B2 | 5/2012 | Hong et al. |
| 8,254,181 | B2 | 8/2012 | Hwang et al. |
| 8,305,103 | B2 | 11/2012 | Kang et al. |
| 8,312,349 | B2 | 11/2012 | Reche et al. |
| 8,412,985 | B1 | 4/2013 | Bowers et al. |
| 8,915,616 | B2 * | 12/2014 | Jeon et al. ..................... 362/294 |
| 2002/0024846 | A1 | 2/2002 | Kawahara et al. |
| 2002/0076951 | A1 | 6/2002 | Roy |
| 2002/0083299 | A1 | 6/2002 | Van Huben et al. |
| 2002/0152305 | A1 | 10/2002 | Jackson et al. |
| 2002/0162075 | A1 | 10/2002 | Talagala et al. |
| 2002/0165896 | A1 | 11/2002 | Kim |
| 2003/0041299 | A1 | 2/2003 | Kanazawa et al. |
| 2003/0043829 | A1 | 3/2003 | Rashid et al. |
| 2003/0088805 | A1 | 5/2003 | Majni et al. |
| 2003/0093628 | A1 | 5/2003 | Matter et al. |
| 2003/0184970 | A1 | 10/2003 | Bosch et al. |
| 2003/0188045 | A1 | 10/2003 | Jacobson |
| 2003/0189856 | A1 | 10/2003 | Cho et al. |
| 2003/0198100 | A1 | 10/2003 | Matsushita et al. |
| 2003/0212719 | A1 | 11/2003 | Yasuda et al. |
| 2004/0024957 | A1 | 2/2004 | Lin et al. |
| 2004/0024963 | A1 | 2/2004 | Talagala et al. |
| 2004/0073829 | A1 | 4/2004 | Olarig |
| 2004/0153902 | A1 | 8/2004 | Machado et al. |
| 2004/0181734 | A1 | 9/2004 | Saliba |
| 2004/0199714 | A1 | 10/2004 | Estakhri et al. |
| 2004/0237018 | A1 | 11/2004 | Riley |
| 2005/0013120 | A1 | 1/2005 | Liu |
| 2005/0060456 | A1 | 3/2005 | Shrader et al. |
| 2005/0060501 | A1 | 3/2005 | Shrader et al. |
| 2005/0082663 | A1 | 4/2005 | Wakiyama et al. |
| 2005/0114587 | A1 | 5/2005 | Chou et al. |
| 2005/0152112 | A1 | 7/2005 | Holmes et al. |
| 2005/0172065 | A1 | 8/2005 | Keays |
| 2005/0172207 | A1 | 8/2005 | Radke et al. |
| 2005/0193161 | A1 | 9/2005 | Lee et al. |
| 2005/0201148 | A1 | 9/2005 | Chen et al. |
| 2005/0231765 | A1 | 10/2005 | So et al. |
| 2005/0257120 | A1 | 11/2005 | Gorobets et al. |
| 2005/0273560 | A1 | 12/2005 | Hulbert et al. |
| 2005/0289314 | A1 | 12/2005 | Adusumilli et al. |
| 2006/0039196 | A1 | 2/2006 | Gorobets et al. |
| 2006/0053246 | A1 | 3/2006 | Lee |
| 2006/0085671 | A1 | 4/2006 | Majni et al. |
| 2006/0136570 | A1 | 6/2006 | Pandya |
| 2006/0156177 | A1 | 7/2006 | Kottapalli et al. |
| 2006/0195650 | A1 | 8/2006 | Su et al. |
| 2006/0259528 | A1 | 11/2006 | Dussud et al. |
| 2007/0001282 | A1 | 1/2007 | Kang et al. |
| 2007/0011413 | A1 | 1/2007 | Nonaka et al. |
| 2007/0057686 | A1 | 3/2007 | Suga et al. |

(56) References Cited

U.S. PATENT DOCUMENTS

| | | |
|---|---|---|
| 2007/0058446 A1 | 3/2007 | Hwang et al. |
| 2007/0061597 A1 | 3/2007 | Holtzman et al. |
| 2007/0074850 A1 | 4/2007 | Peschl |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0091677 A1 | 4/2007 | Lasser et al. |
| 2007/0113019 A1 | 5/2007 | Beukema et al. |
| 2007/0121297 A1 | 5/2007 | Uchizono et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0201274 A1 | 8/2007 | Yu et al. |
| 2007/0208901 A1 | 9/2007 | Purcell et al. |
| 2007/0211436 A1 | 9/2007 | Robinson et al. |
| 2007/0234143 A1 | 10/2007 | Kim |
| 2007/0245061 A1 | 10/2007 | Harriman |
| 2007/0246189 A1 | 10/2007 | Lin et al. |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019095 A1 | 1/2008 | Liu |
| 2008/0019182 A1 | 1/2008 | Yanagidaira et al. |
| 2008/0022163 A1 | 1/2008 | Tanaka et al. |
| 2008/0043435 A1 | 2/2008 | Yip et al. |
| 2008/0052446 A1 | 2/2008 | Lasser et al. |
| 2008/0056005 A1 | 3/2008 | Aritome |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0158818 A1 | 7/2008 | Clidaras et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0236791 A1 | 10/2008 | Wayman |
| 2008/0252324 A1 | 10/2008 | Barabi et al. |
| 2008/0254573 A1 | 10/2008 | Sir et al. |
| 2008/0266807 A1 | 10/2008 | Lakin et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0291636 A1 | 11/2008 | Mori et al. |
| 2009/0003058 A1 | 1/2009 | Kang |
| 2009/0037652 A1 | 2/2009 | Yu et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0273898 A1 | 11/2009 | Imsand |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0302458 A1 | 12/2009 | Kubo et al. |
| 2009/0309214 A1 | 12/2009 | Szewerenko et al. |
| 2009/0319864 A1 | 12/2009 | Shrader |
| 2010/0008034 A1 | 1/2010 | Hinkle |
| 2010/0061151 A1 | 3/2010 | Miwa et al. |
| 2010/0073880 A1 | 3/2010 | Liu |
| 2010/0091463 A1 | 4/2010 | Buresch et al. |
| 2010/0103737 A1 | 4/2010 | Park |
| 2010/0118496 A1 | 5/2010 | Lo |
| 2010/0161936 A1 | 6/2010 | Royer et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0224985 A1 | 9/2010 | Michael et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0296255 A1 | 11/2010 | Maloney |
| 2010/0328887 A1 | 12/2010 | Refai-Ahmed et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0132000 A1 | 6/2011 | Deane et al. |
| 2011/0173378 A1 | 7/2011 | Filor et al. |
| 2011/0182035 A1 | 7/2011 | Yajima |
| 2011/0188205 A1 | 8/2011 | MacManus et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2011/0299244 A1 | 12/2011 | Dede et al. |
| 2011/0317359 A1 | 12/2011 | Wei et al. |
| 2012/0014067 A1 | 1/2012 | Siracki |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0151294 A1 | 6/2012 | Yoo et al. |
| 2012/0170224 A1 | 7/2012 | Fowler et al. |
| 2012/0195126 A1 | 8/2012 | Roohparvar |
| 2012/0201007 A1 | 8/2012 | Yeh et al. |
| 2012/0239976 A1 | 9/2012 | Cometti et al. |
| 2012/0284587 A1 | 11/2012 | Yu et al. |
| 2012/0293962 A1 | 11/2012 | McCluskey et al. |
| 2013/0285686 A1 | 10/2013 | Malik et al. |
| 2013/0307060 A1 | 11/2013 | Wang et al. |
| 2014/0136927 A1 | 5/2014 | Li et al. |

FOREIGN PATENT DOCUMENTS

| | | |
|---|---|---|
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 2 600 700 A1 | 6/2001 |
| EP | 1465203 A1 | 10/2004 |
| EP | 1 990 921 A2 | 11/2008 |
| EP | 2 066 158 A2 | 6/2009 |
| EP | 2 395 827 A2 | 12/2011 |
| FR | 2560731 | 9/1985 |
| JP | 06006064 | 1/1994 |
| JP | 2002-532806 S | 10/2002 |
| JP | 2003 188565 | 7/2003 |
| WO | WO 88/07193 | 3/1988 |
| WO | WO 03/094586 A1 | 11/2003 |
| WO | WO 2004/086827 A2 | 10/2004 |
| WO | WO 2007/036834 A2 | 4/2007 |
| WO | WO 2007/080586 A2 | 7/2007 |
| WO | WO 2008/013850 A2 | 1/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |

(56) References Cited

FOREIGN PATENT DOCUMENTS

| | | |
|---|---|---|
| WO | WO 2011/024015 | 3/2011 |
| WO | WO 2013/080341 | 6/2013 |

OTHER PUBLICATIONS

International Search Report and Written Opinion dated Nov. 20, 2014, received in International Patent Application No. PCT/US2014/020290, which corresponds to U.S. Appl. No. 13/791,797, 21 pages (Dean).
International Search Report and Written Opinion dated Dec. 23, 2014, received in International Patent Application No. PCT/US2014/042772, which corresponds to U.S. Appl. No. 13/922,105, 10 pages (Dean).
Barr, Introduction to Watchdog Timers, Oct. 2001, 3 pgs.
Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
International Search Report and Written Opinion dated Apr. 28, 2015 received in International Patent Application No. PCT/US2015/014563, which corresponds to U.S. Appl. No. 14/179,247, 9 pages (Ellis).
International Search Report and Written Opinion dated May 8, 2015, received in International Patent Application No. PCT/US2015/017722, which corresponds to U.S. Appl. No. 14/277,716, 9 pages (Dean).
International Search Report and Written Opinion dated May 13, 2015, received in International Patent Application No. PCT/US2015/017724, which corresponds to U.S. Appl. No. 14/244,734, 12 pages, (Dean).
International Search Report and Written Opinion dated May 18, 2015, received in International Patent Application No. PCT/US2015/016656, which corresponds to U.S. Appl. No. 14/275,690, 14 pages (Wright).
International Search Report and Written Opinion dated May 28, 2015, received in International Patent Application No. PCT/US2015/017729, which corresponds to U.S. Appl. No. 14/244,745, 14 pages (Ellis).
International Search Report and Written Opinion dated Jul. 25, 2014, received in International Patent Application No. PCT/US2014/029453, which corresponds to U.S. Appl. No. 13/963,444, 9 pages (Frayer).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Invitation to Pay Additional Fees dated Jul. 25, 2014, received in International Patent Application No. PCT/US2014/02190, which corresponds to U.S. Appl. No. 13/791,797, 8 pages (Dean).
International Search Report and Written Opinion dated Sep. 12, 2014, received in International patent Application No. PCT/US2014/0413146.

\* cited by examiner (Side View)

(A-A' Cross-section View)

(A-A' Cross-section View)

(Side View)

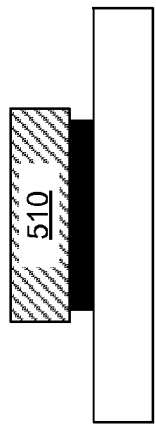
FIG. 5A
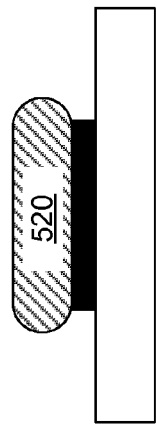
FIG. 5B
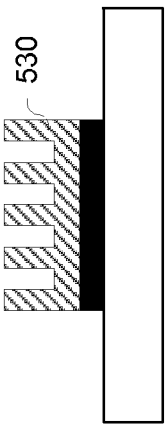
FIG. 5C
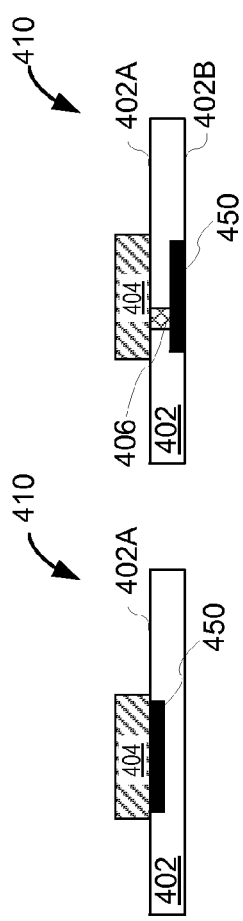
FIG. 4B
FIG. 4A
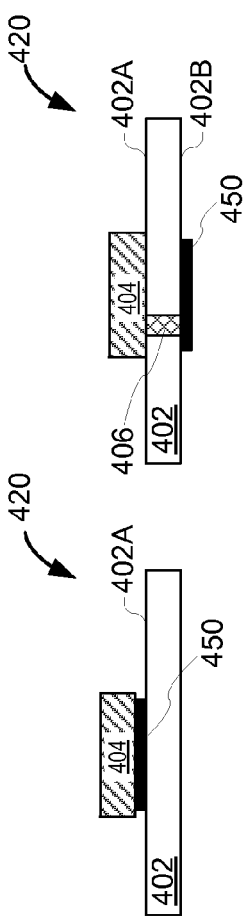
FIG. 4D
FIG. 4C
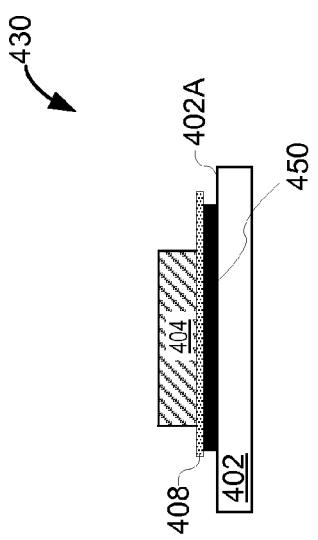
FIG. 4E

SYSTEM AND METHOD FOR HEAT DISSIPATION

RELATED APPLICATIONS

This application claims priority to U.S. Provisional Patent Application 61/887,299, filed Oct. 4, 2013, which is hereby incorporated by reference in its entirety.

TECHNICAL FIELD

The disclosed embodiments relate generally to heat dissipation, and in particular, to dissipating heat generated by electronic components in electronic systems.

BACKGROUND

Many of today's electronic systems, such as desktop computers and servers, include semiconductor memory devices or modules. Such semiconductor memory devices or modules include solid state drives (SSDs), dual in-line memory modules (DIMMs), and Small Outline-DIMMs (SO-DIMM), all of which utilize memory cells to store data as an electrical charge or voltage.

Improvements in storage density, including increased density of memory cells on each individual module, have been brought about by manufacturing improvements and the ability to accommodate more memory integrated circuits per module using board-level packaging techniques. As this storage density has increased, so has the heat generated from the tightly packed integrated circuits. This increased heat can ultimately lead device failures. To dissipate this heat, memory modules often make use of heat sinks coupled to the semiconductor memory devices or modules.

Heat generation is especially problematic in blade server systems, where high-density SSDs and DIMMs are frequently accessed for memory read and write operations. Although heat sinks may be mounted on the SSDs and DIMMs and air flow from fans is routed through the heat sinks to help dissipate the heat, the increasingly compact form factor of the DIMMs and SSDs oftentimes compromises the heat dissipation effects of the heat sinks and the air flow around them. In light of this problem, memory slots are often intentionally left empty in order to reduce the heat density within the system. Alternatively, server fans are operated at higher rotational speeds or for longer periods in order to increase the air flow and heat dissipation. However, empty memory slots and higher speed fans undesirably compromise the storage density, noise generation, fan replacement costs, and operating expense of these systems. Therefore, it is desirable to provide a method and system that efficiently manages the air flow past the heat sinks while maintaining or improving the cost, yield, and performance characteristics and storage density of electronics systems.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to manage heat flow for dissipating heat generated by electronic components integrated in electronic modules of an electronic system (e.g., a memory system that includes closely spaced memory modules). In some embodiments, at least two heat sinks are disposed on a substrate of a first module, and at least one heat sink is disposed on a substrate of a second module. The at least one heat sink in the second module is positioned in a gap between the at least two heat sinks in the first module. In some implementations, the number of heat sinks, the configuration of the heat sinks, and/or a subset of geometric parameters for the locations, sizes and shapes of the heat sinks are engineered for the purpose of disturbing and mixing the air and air flow between the first and second modules. This mixing of the air and air flow between these two adjacent modules allows more heat to be dissipated away from the modules.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 4A and 4B illustrate an exemplary electronic module in which at least one electronic component is monolithically integrated on a front side and a backside of a substrate in accordance with some embodiments.

FIGS. 4C and 4D illustrate an exemplary electronic module in which at least one electronic component is integrated on a front side and a backside of a substrate in a hybrid manner in accordance with some embodiments.

FIG. 4E illustrates an exemplary electronic module that includes a heat spreader in accordance with some embodiments in the invention.

FIGS. 5A-5C illustrate exemplary heat sinks that have different geometrical shapes in accordance with some embodiments.

Figure 1:
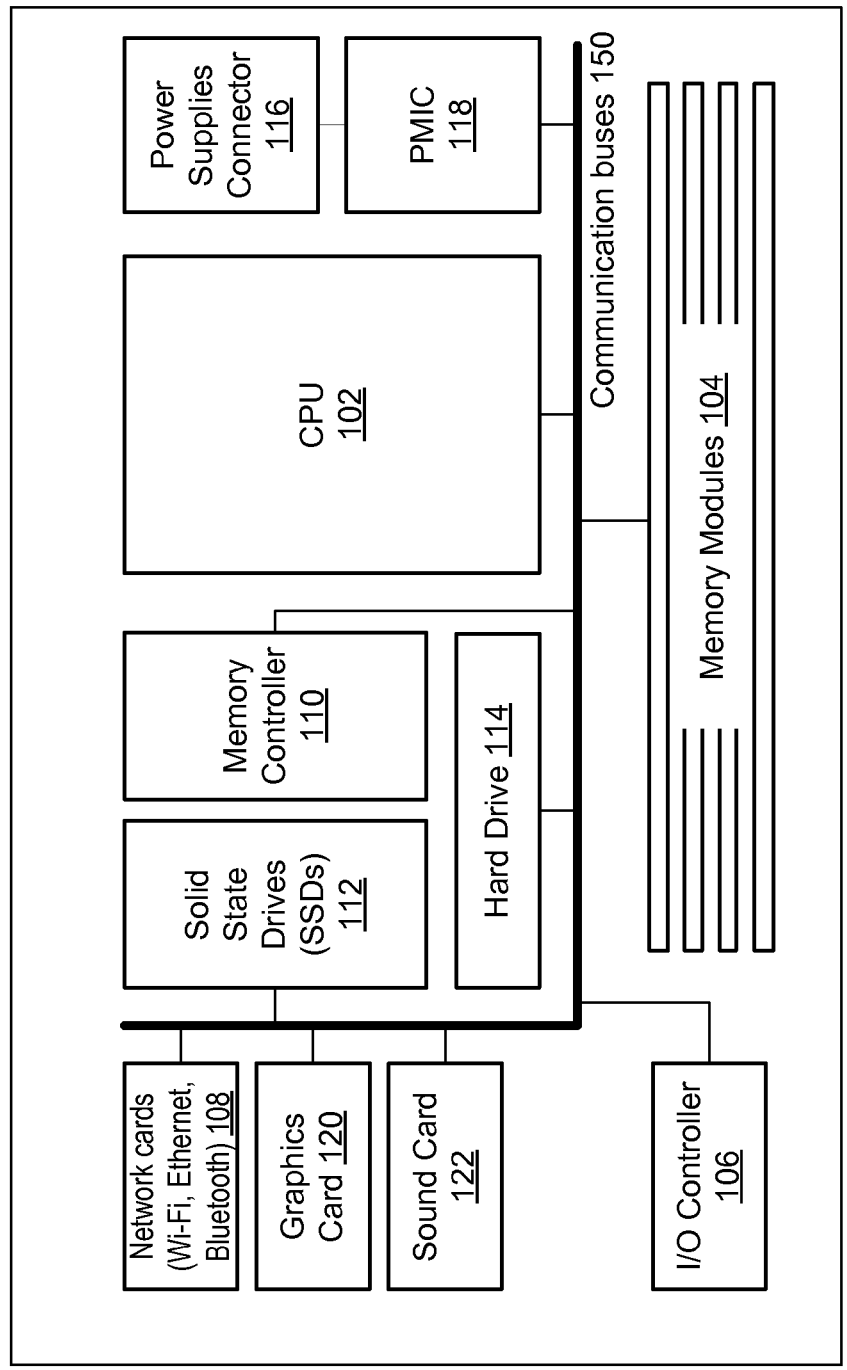
FIG. 1 illustrates a block diagram of an exemplary system module in a typical computational device in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used or integrated into electronic systems. In particular, the heat sinks, geometric configurations, locations, sizes and/or shapes of the modules and heat sinks described herein facilitate heat flow past the heat sinks to efficiently dissipate heat generated by the electronic components.

One example of such an electronic system is a memory system that is commonly integrated in many computers and consumer electronic devices. The memory system oftentimes includes closely placed memory modules that require efficient heat dissipation. For ease of explanation, some embodiments are described herein in the context of the memory system. However, one of skill in the art will recognize that the implementations described herein are not limited to memory systems, and, instead, are generally applicable to any electronic system that includes two or more electronic modules integrated in a limited space and which requires efficient dissipation of generated heat.

More specifically, according to some embodiments, there is provided an electronic system. The electronic system includes first and second modules. The first module includes at least one first-module electronic component, and at least two first-module heat sinks thermally coupled to the at least one first-module electronic component, wherein there is a gap between the at least two first-module heat sinks. The second module includes at least one second-module electronic component, and at least one second-module heat sink thermally coupled to the at least one second-module electronic component. The first and second modules are distant from each other by a predetermined distance such that the second-module heat sink is disposed in the gap between the at least two first-module heat sinks.

In some embodiments, the first module is a first memory module including a first-module substrate, and the at least one first-module electronic component is a memory integrated circuit coupled on the first-module substrate. The second module is a second memory module including a second-module substrate, and the at least one second-module electronic component is a memory integrated circuit coupled on the second-module substrate In some embodiments, the at least two first-module heat sinks and the at least one second-module heat sink are configured for mixing air and air flow between the first module and the second module.

In some embodiments, the first module comprises a plurality of first-module heat sinks including the at least two first-module heat sinks, and the second module comprises a plurality of second-module heat sinks including the at least one second-module heat sink. The plurality of second-module heat sinks alternate with the plurality of first-module heat sinks, such that each of the plurality of second-module heat sinks is disposed in a respective gap between two of the plurality of first-module heat sinks.

In some embodiments, the at least two first-module heat sinks have a first thickness, and the at least one second-module heat sink has a second thickness. A sum of the first and second thicknesses is smaller than the predetermined distance.

In some embodiments, the at least two first-module heat sinks and the at least one second-module heat sink have a combined length along a planar axis that is substantially parallel to the first module and the second module, wherein the combined length is less than a length of the first module or the second module along the planar axis. Additionally, in some implementations, the combined length is selected from a group of one third, one quarter and one tenth of the length of the first module or the second module.

In some embodiments, along an alternative planar axis that is substantially parallel to the first module and the second module, at least one heat sink among the at least two first-module heat sinks and the at least one second-module heat sink extends to cover more than half of the module width of the respective module along the alternative planar axis. Additionally, in some implementations, along the alternative planar axis, a subset of the at least two first-module heat sinks extend beyond the edges of a substrate of the first module, and are physically coupled to one another at their extended ends.

In some embodiments, a heat spreader that has a substantially high thermal conductivity is disposed beneath each of the at least two first-module heat sinks to evenly spread heat dissipated from the at least one first-module electronic component.

In some embodiments, the at least two first-module heat sinks or the at least one second-module heat sink comprises a two-dimensional array of heat sinks covering at least a part of the substrate of the respective module. Additionally, in some implementations, the second-module heat sink is disposed in the gap between the at least two first-module heat sinks along a planar axis that is substantially parallel to the first module or the second module, and a subset of the at least one second-module heat sink alternates with a subset of the at least two first-module heat sinks along an alternative planar axis that is substantially parallel to the first or second substrate and perpendicular to the planar axis.

In some embodiments, the at least one first-module electronic component is coupled between the at least two first-module heat sinks and the substrate of the first module.

In some embodiments, the at least one first-module electronic component is monolithically integrated on a front side or a back side of the first module.

In some embodiments, the at least one first-module electronic component is mounted on a back side of the first module, and heat generated by the at least one first-module electronic component is conducted via the substrate of the first module to the at least two first-module heat sinks that are coupled on a front side of the first module.

In some embodiments, at least one heat sink of the at least two first-module heat sinks and the at least one second-module heat sink has rounded corners and edges to control air flow between the first and second modules.

In some embodiments, at least one heat sink of the at least two first-module heat sinks and the at least one second-module heat sink has a finned surface facing towards a separation gap between the first and second modules.

In some embodiments, the at least two first-module heat sinks are physically coupled together by a bridging heat sink structure that has a smaller thickness than the respective thickness of the at least two first-module heat sinks.

In some embodiments, a layer of thermally conductive material is applied to couple the at least two first-module heat sinks and the at least one second-module heat sink to their respective electronic component or to their respective module.

According to another embodiment, there is provided a memory system that includes first and second memory modules. The first memory module includes at least one first-module memory component, and at least two first-module heat sinks thermally coupled to the at least one first-module memory component, wherein there is a gap between the at least two first-module heat sinks. The second memory module includes at least one second-module memory component, and at least one second-module heat sink thermally coupled to the at least one second-module memory component. The first and second modules are distant from each other by a predetermined distance such that the second-module heat sink is disposed in the gap between the at least two first-module heat sinks.

Finally, according to another embodiment, there is provided a method of dissipating heat in an electronic system. At least two first-module heat sinks are mounted on a substrate of a first module to dissipate heat generated by at least one first-module electronic component integrated on the first module, wherein there is a gap between the at least two first-module heat sinks. At least one second-module heat sink is mounted on a substrate of a second module to dissipate heat generated by at least one second-module electronic component integrated on the second module. The first module and the second module are then integrated into the electronic system, such that at least a part of the first and second modules face one another and are separated by a predetermined distance, wherein the second-module heat sink is disposed in the gap between the at least two first-module heat sinks.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 illustrates a block diagram 100 of an exemplary system module in a typical computational device in accordance with some embodiments. The system module 100 in the computational device includes at least a central processing unit (CPU) 102, memory modules 104 for storing programs, instructions and data, one or more communications interfaces such as an input/output (I/O) controller 106 and network interfaces 108, and one or more communication buses 150 for interconnecting these components. In some embodiments, the I/O controller 106 allows the CPU 102 to communicate with an I/O device (e.g., a keyboard, a mouse or a track-pad) via a universal serial bus interface. In some embodiments, the network interfaces 108 comprises one or more interfaces for Wi-Fi, Ethernet and Bluetooth networks, each allowing the computational device to exchange data with an external source, e.g., a server or another computational device. In some embodiments, the communication buses 150 include circuitry (sometimes called a chipset) that interconnects and controls communications among various system components included in the system module.

In some embodiments, the memory modules 104 include high-speed random access memory, such as DRAM, SRAM, DDR RAM or other random access solid state memory devices; and optionally include non-volatile memory, such as one or more magnetic disk storage devices, optical disk storage devices, flash memory devices, or other non-volatile solid state storage devices. In some embodiments, the memory modules 104, or alternatively the non-volatile memory device(s) within memory modules 104, include a non-transitory computer readable storage medium. One of skill in the art knows that more new non-transitory computer readable storage media will be viable, as new data storage technologies are developed for storing information. These new non-transitory computer readable storage media include, but are not limited to, those manufactured from biological materials, nanowires, carbon nanotubes and individual molecules, even though the respective data storage technologies are still under development and yet to be commercialized.

In some implementations, memory slots are reserved on the system module 100 for receiving the memory modules 104. Once inserted into the memory slots, memory modules 104 are integrated into the system module 100.

In many implementations, the system module 100 further includes one or more components selected from:

A memory controller 110 that controls communication between CPU 102 and memory components, including memory modules 104, in the computational device.

Solid state drives (SSDs) 112 that apply integrated circuit assemblies to store data in the computational device, and in many embodiments, are based on NAND or NOR memory configurations. It is noted that like the non-transitory computer readable storage media in the memory modules 104, more storage configurations will be viable for the SSDs 112, as new data storage technologies are developed for storing information. For example, for the next generation SSDs, the memory cells may be potentially made from biological materials, nanowires, carbon nanotubes, and individual molecules as well.

A hard drive 114 that is a conventional data storage device used for storing and retrieving digital information based on electromechanical magnetic disks.

A power supply connector 116 that is electrically coupled to receive an external power supply.

Power management integrated circuit (PMIC) 118 that modulates the received external power supply to other desired DC voltage levels, e.g., 5V, 3.3V or 1.8V, as required by various components or circuits within the computational device.

A graphics card 120 that generates a feed of output images to one or more display devices according to their desirable image/video formats.

A sound card 122 that facilitates the input and output of audio signals to and from the computational device under control of computer programs.

In many situations, some of the aforementioned components generate a significant amount of heat during normal operation, and therefore, are integrated with separate heat sinks in order to reduce the temperatures of the corresponding components to which they are thermally coupled. As a specific example, heat sinks are used in blade servers to cool down the dual in-line memory modules (DIMM) of the solid state drives 112 or the memory modules 104. However, as the data workload in these blade servers increases and the form factor of the DIMM becomes more compact (e.g., closely placed memory slots in the memory modules 104), it becomes more difficult for conventional heat sinks to dissipate the generated heat. Therefore, in various embodiments of the invention, the number of heat sinks and the geometric features (e.g., configurations, locations, sizes, shapes, etc.) of the heat sinks in an electronic system (such as the solid state drives 112 and the memory modules 104) are further adjusted to better control the air flow past the heat sinks, such that the heat dissipation efficiency is improved for the corresponding electronic components in the electronic system.

Figure 2A:
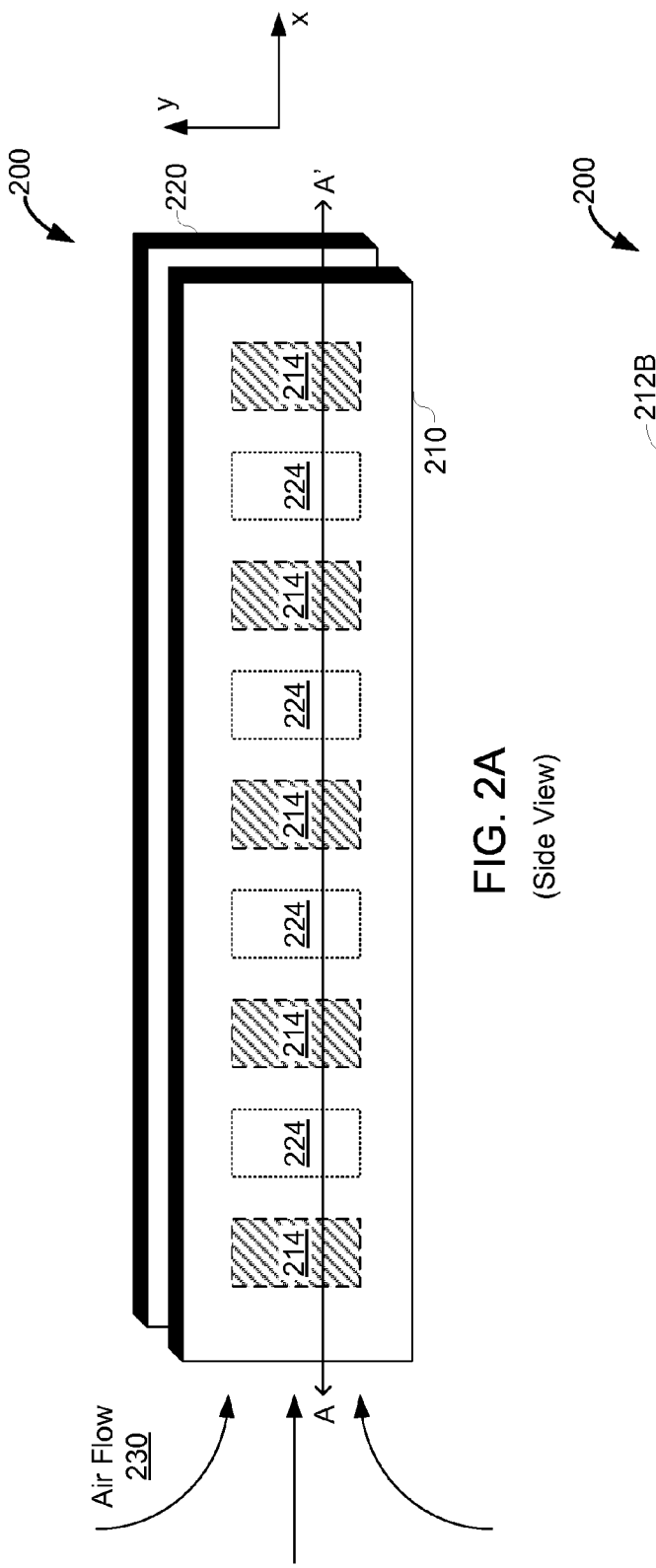
FIGS. 2A and 2B illustrate a side perspective view and a cross-sectional view of an exemplary electronic system that is integrated with heat sinks for heat dissipation in accordance with some embodiments.
Figure 2B:
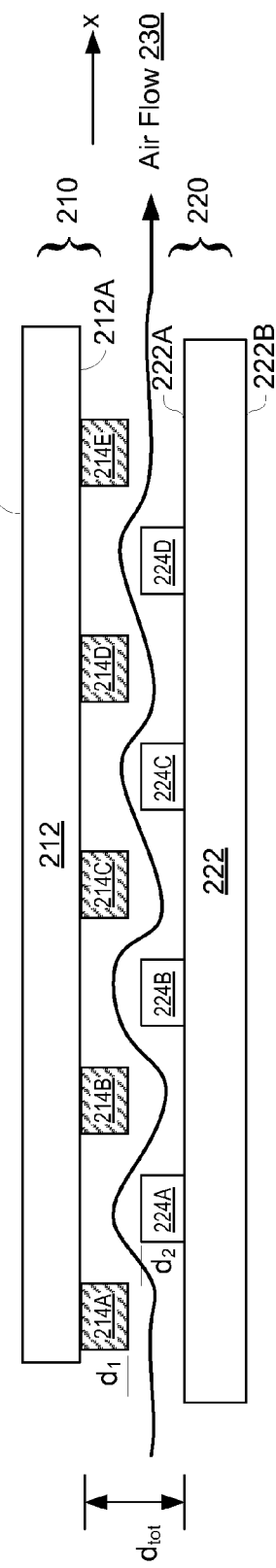

FIGS. 2A and 2B illustrate a side perspective view and a cross-sectional view, respectively, of an exemplary electronic system 200 that is integrated with heat sinks for heat dissipation in accordance with some embodiments. The cross-sectional view shown in FIG. 2B is taken along line A-A' of the side view of FIG. 2A. The electronic system 200 includes a first module 210 and a second module 220. The first module 210 includes a substrate 212 that further includes a substantially planar front side 212A and a substantially planar back side 212B, and similarly, the second module 220 includes a substrate 222 that further includes a substantially planar front side 222A and a substantially planar back side 222B. Each of the first module 210 or the second module 220 includes or integrates at least one electronic component on the respective substrate. Each electronic component is included or integrated either on the front side or the back side of the respective substrate of the corresponding module. For brevity, all of the respective electronic component(s) on the substrate 212 or 222 are not illustrated in FIGS. 2A and 2B, and more details concerning placement of the electronic component(s) are explained below with reference to FIGS. 4A-4E.

The first module 210 and the second module 220 are disposed adjacent one another and are separated by a predetermined distance $d_{tot}$. As a result of such a placement, the front sides 212A and 222A face one another. In some implementations, the substrates of the first module 210 and the second module 220 are disposed substantially parallel to one another. In some implementations, the substrates of the first module 210 and the second module 220 have different sizes, and at least a part of the front side 212A of the first module 210 faces another part of the front side 222A of the second module 220.

The first module 210 further includes at least two heat sinks 214, e.g., heat sinks 214A and 214B, that are disposed on the front side 212A of the first module 210 and separated by a gap. The at least two heat sinks 214 are thermally coupled to electronic component(s) on substrate 212 to absorb and dissipate heat generated by the electronic component(s). Similarly, the second module 220 further includes at least one heat sink 224, e.g., a heat sink 224A, that is disposed on the front side 222A of the second module 220. The at least one heat sink 224 are thermally coupled to electronic component(s) on the substrate 222 to absorb and dissipate heat generated by the electronic components(s). As seen from the cross section along line A-A', the heat sink 224A is disposed in the gap between the heat sinks 214A and 214B. Specifically, the heat sink 224 is regarded as being disposed in the gap between the heat sinks 214A and 214B, when their projected positions are so arranged on a planar axis (x-axis) that is substantially parallel to the first module 210 or the second module 220.

In addition, in the description of the embodiments of the invention, the front side of a respective substrate is defined as the side on which the heat sinks are disposed.

In some implementations, the first module 210 comprises a plurality of first heat sinks 214A-214E including the at least two first-module heat sinks 214A and 214B, and the second module 220 comprises a plurality of second heat sinks 224A-224D including the at least one second-module heat sink 224A. The plurality of second heat sinks 224A-224D alternate with the plurality of first heat sinks 214A-214E along the planar axis, such that each heat sink of the heat sinks 224A-224D on the second module 220 is disposed in a respective gap between two heat sinks of the heat sinks 214A-214E on the first module 210. From another perspective, some of the heat sinks 214A-214E on the first module 210 are also disposed in corresponding gaps among the heat sinks 224A-224D.

The heat sinks 214A-E and 224A-D are passive components that have certain heat capacity. Heat sinks 214 and 224 are mounted on the substrates 212 and 222 to absorb heat generated by electronic components integrated or coupled to the substrates 212 and 222, respectively, when the substrates do not have sufficient heat dissipation capability. Upon absorption of the heat, the heat sinks 214A-E and 224A-D then dissipate the heat to a cooling medium that surrounds said heat sinks. Specifically in many embodiments, the cooling medium is air flow that passes over the surfaces of said heat sinks. As shown in FIG. 2B, an air channel is formed between the substrates 212 and 222, and air flow 230 passes through the air channel to carry away the heat dissipated from the heat sinks 214A-E and 224A-D. Therefore, the heat sinks 214 and 224 having sufficiently large heat capacity and surface areas are used to dissipate heat generated by the electronic components on the respective substrates. This protects the electronic components from elevated temperatures and ensures a normal operating temperature range.

In many implementations, each of the heat sinks 214A-E and 224A-D is attached on the respective substrate and/or the electronic components integrated on the respective substrate by using a layer of adhesive material. Typically, the adhesive material has a high thermal conductivity. When it is applied on the back sides of the respective heat sinks, the adhesive material substantially fills the air gaps between the heat sinks and the underlying substrates or electronic components, thereby allowing the generated heat to be transferred to the heat sinks. In many embodiments, the thickness of the adhesive material is much thinner than those of the heat sinks. For brevity, the layer of thermally conductive adhesive material is not illustrated in the figures of the present invention.

In accordance with various embodiments of the invention, the number of heat sinks and the geometric features (e.g., configurations, locations, sizes, shapes, etc.) are designed to disturb or mix the air flow 230 to efficiently transfer heat from the heat sinks to the air surrounding them. Specifically, in some implementations, once the respective number of the heat sinks 214 or 224 is determined on each substrate 212 or 222, the heat sinks 214 or 224 are disposed on the respective front side according to a certain configuration, e.g., a two-directional array or a one-dimensional row. In accordance with the configuration, each heat sink is mounted on specific locations on the respective substrate. In some embodiments, the width, length, thickness, and shape of each heat sink is selected in order to ensure maximum mixing of the air flow 230 around the heat sinks. Further examples and details are explained below with reference to FIGS. 2A-2D, 3, 4A-4E and 5A-5C.

As a specific example, in FIG. 2A, a row of heat sinks 214 are disposed on the front side 212A of the substrate 212 in the first module 210, and another row of heat sinks 224 are disposed on the front side 222A of the substrate 222 in the first module 220. However, in some embodiments, the row of heat sinks 214 and the row of heat sinks 224 are not aligned, and rather are shifted by a certain offset.

Each heat sink 214 or 224 has a respective length along the planar axis (i.e., x-axis). The respective heat sink length is substantially equal to a predetermined fraction of a respective module length measured for the first module 210 or the second module 220 along the planar axis. In some implementations, the predetermined fraction is selected from one third, one quarter, one tenth and one twentieth. Accordingly, gaps between every two heat sinks on the same substrate or on the opposite substrates are adjusted based on the number of heat sinks and the predetermined fraction.

In some embodiments, the heat sinks 214 and 224 have a combined length along the planar axis, and the combined length is less than the module length of the first module or the second module. Additionally, in some implementations, the combined length is selected from a group of one third, one quarter and one tenth of the module length.

Further, in the specific embodiment shown in FIG. 2A, the widths of the heat sinks 214 and 224 extend to cover more than half of the respect module width along an alternative planar axis (i.e., y-axis), which is substantially parallel to the front sides 212A and 222A and is perpendicular to the planar axis (x-axis). In some implementations, the widths of the heat sinks 214 and 224 extend to cover the entire module width of the respective module. In some implementations, each heat sink 214 or 224 has a respective width that is substantially equal to another predetermined fraction of a respective module width measured along the alternative planar axis. In some embodiments, this predetermined fraction is selected from one third, one quarter, and one tenth.

In some other implementations, the heat sinks 214 or 224 are positioned to address the heat density on the respective substrates 210 and 220. For example, more heat sinks are placed around an area that has a larger heat density. Alternatively, in some implementations, the sizes (e.g., length and width) of the heat sinks 214 or 224 are similarly adjusted according to the heat density on the respective substrate 210 or 220. One or more heat sinks having larger widths and/or lengths are placed around the area that has a larger heat density.

Further as shown in FIG. 2B, in some embodiments, the heat sinks 214 protrude into the air channel by a thickness $d_1$. The heat sinks 224 protrude in the air channel by thickness $d_2$. When the heat sinks are not used or a single heat sink covers the entire substrate of the substrate 212 or 222, the air flow 230 through the channel is laminar and little mixing occurs. However, if the heat sinks are positioned as described herein, the air flow is disturbed by the alternating protrusions of the heat sinks into the channel, and the air is better mixed, resulting in a more turbulent air flow and a better heat transfer between the air and the heat sinks. In other words, boundary layer conditions concerning the substrate 212 or 222 and the corresponding heat sinks are adjusted by the strategic placement of the heat sinks 214 or 224 within the channel between the modules, thereby allowing the air flow 230 to mix, and, therefore, more efficiently cool down the modules 210 and 220.

In some situations, the sum of thicknesses $d_1$ and $d_2$ is substantially smaller than the predetermined distance $d_{tot}$, and the air flow is disturbed, but can still pass through the air channel smoothly and quickly. Alternatively in some other situations, the sum of thicknesses $d_1$ and $d_2$ is substantially larger than the predetermined distance $d_{tot}$. Here, the heat sinks significantly overlap with one another, and the air flow needs to traverse each heat sink to flow through the air channel. While the air flow passes the air channel at a reduced rate, it mixes more. Generally, thicknesses $d_1$ and $d_2$ are selected to result in better air mixing or turbulence in the air channel without adversely affecting the flow of the air through the channel.

In some embodiments, the first module 210 is a memory module that includes the substrate 212, at least one memory component that is a memory integrated circuit integrated on the substrate 210, and the heat sinks 214 that are disposed on the front side 212A of the first module 210 to absorb and dissipate heat generated by the memory component. Similarly, in some embodiments, the second module 220 is also a memory module that includes the substrate 222, at least one memory component that is a memory integrated circuit, and the heat sinks 224. In some situations, the memory modules 210 and 220 are identical modules placed in parallel with one another, and sometimes, inserted into two adjacent memory slots on a board of an electronic device.

In some embodiments, even though the at least one memory component is disposed at the same location on (or in) the respective substrate, the heat sinks 214 and 224 are disposed at different locations and/or sides of the respective substrate of the memory modules 210 and 220, respectively.

For example, as shown in FIG. 2B, the respective memory components on the memory modules 210 and 220 may be disposed on the side 212B and the side 222A, i.e., facing the same direction, while the heat sinks are mounted on opposing sides 212A and 222A.

Furthermore, in some embodiments, in addition to the heat sinks 214 and 224 disposed on the front sides 212A and 222A, more heat sinks are disposed on at least one of the back sides 212B and 222B of the substrates 212 and 222 in the first module 210 and the second module 220. Optionally, these additional heat sinks are arranged in a similar alternating configuration with heat sinks on a third module (not shown) disposed adjacent to the first module 210 or the second module 220 and has its front side facing the back side 212B or 222B.

Figure 2C:
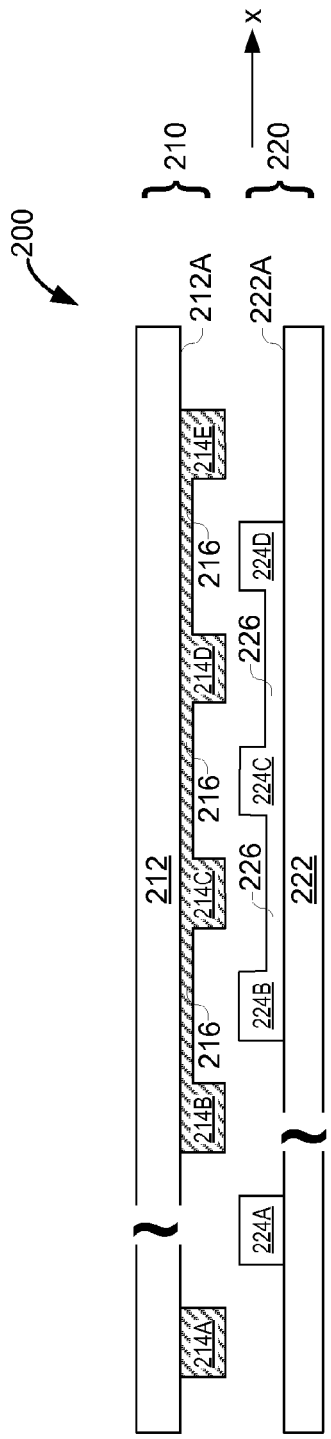
FIG. 2C illustrates another cross-sectional view of an exemplary electronic system that includes heat sinks in accordance with some embodiments.

In some embodiments, separate heat sinks mounted on the same substrate in an electronic module are mechanically and/or thermally connected by a coupling structure. FIG. 2C illustrates another cross-sectional view of an exemplary electronic system 200 that uses connected heat sinks. At least two of the heat sinks 214 or two of the heat sinks 224 are physically coupled together by a bridging heat sink structure 216 or 226, respectively. In some embodiments, every two neighboring heat sinks 214 on the first module 210 are coupled to one another by a bridging heat sink structure 216, and therefore, the heat sinks 214 form a single heat sink mounted on the front side 212A of the first module 210. In some implementations, each bridging heat sink structure 216 or 226 has a thickness smaller than that of heat sinks 214 or 224, respectively.

Figure 2D:
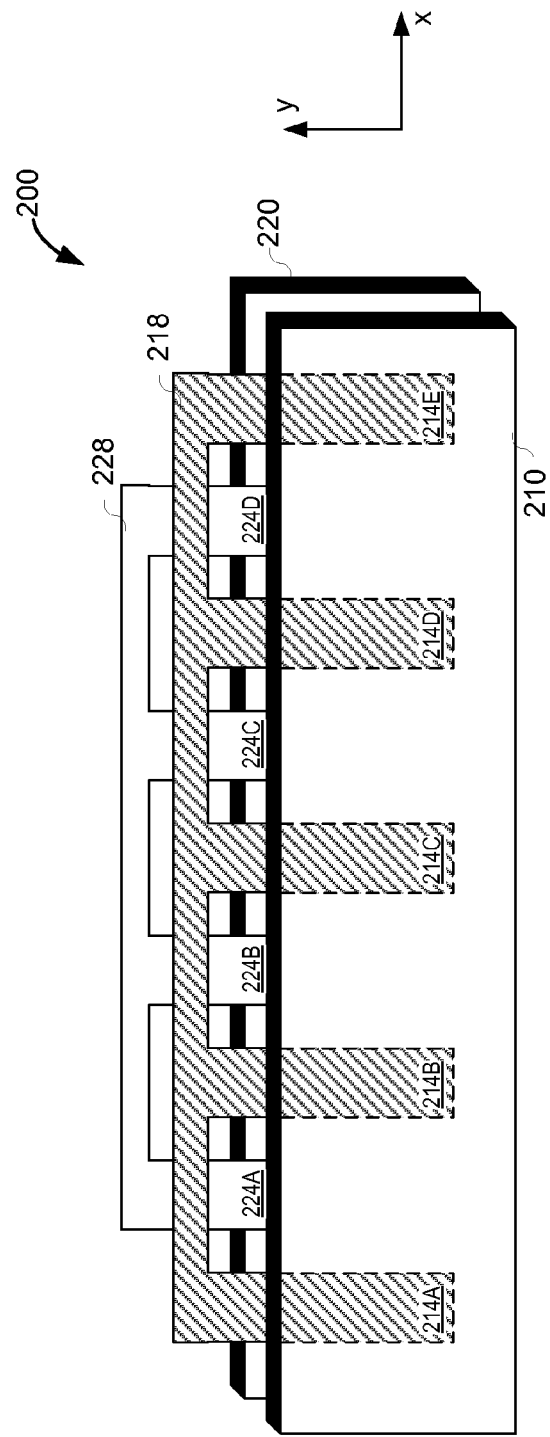
FIG. 2D illustrates a side view of another exemplary electronic system that includes heat sinks with extended geometric sizes in accordance with some embodiments.

Alternatively, in some embodiments, at least some of the heat sinks extend beyond an edge of a respective substrate, and are physically coupled together at their extended ends. FIG. 2D illustrates a side view of another exemplary electronic system 200 that uses heat sinks with extended geometric sizes in accordance with some embodiments. Specifically, on the alternative planar axis (y-axis), a subset of heat sinks 214 extend beyond the edges of the substrate 212, and are coupled together at the extended ends 218 to form a single heat sink. In some other implementations, a subset of heat sinks 224 also extend beyond the corresponding edges of the substrate 222, and are coupled together at the extended ends 228 to form another single heat sink.

In some embodiments, the extended ends 218 and 228 are further coupled together to combine the subset of heat sinks 214 and the subset of heat sinks 224 into a single heat sink. In some embodiments, when the first module 210 and the second module 220 are memory modules that are configured to be inserted into adjacent memory slots on a computer motherboard, the extended ends 218 and 228 are designed in a manner that is compatible with the spacing requirement between the memory slots. As shown in FIGS. 2C and 2D, such an embodiment reduces the number of discrete heat sink components, and simplifies the assembly process by avoiding assembly of a large number of individual heat sinks.

Figure 3:
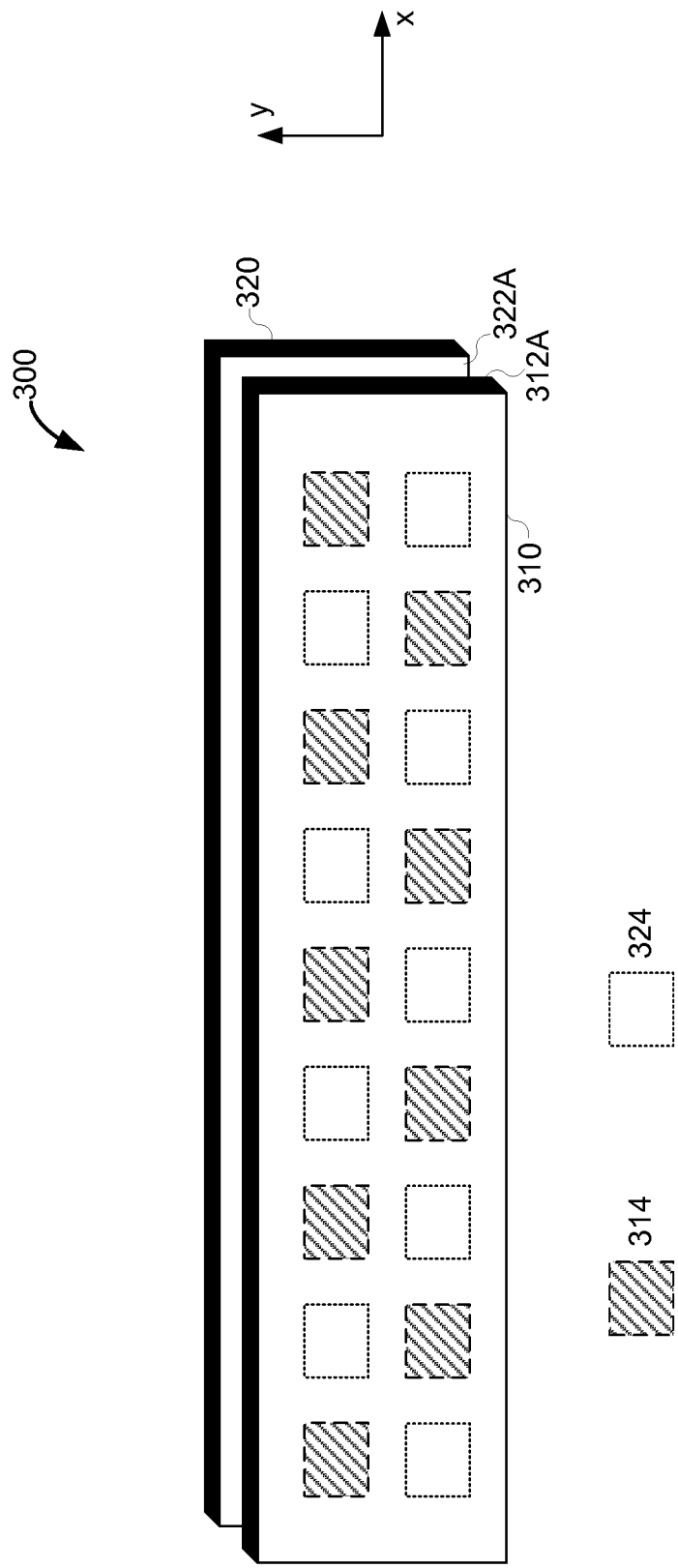
FIG. 3 illustrates an exemplary electronic system including electronic modules that include a respective array of heat sinks in accordance with some embodiments.

FIG. 3 illustrates an exemplary electronic system 300 including electronic modules (e.g., a first module 310 and a second module 320) that include a respective array of heat sinks. The first module 310 and the second module 320 are arranged with their front sides 312A and 322A facing one another and are separated by a predetermined distance. Heat sinks 314 are disposed on the front side 312A of a substrate 312 of the first module 310, and form a first two-dimensional array that covers at least a part of the front side 312A of the first module 310. Similarly, heat sinks 324 are disposed on the front side 322A of a substrate 322 of the second module 320, and form a second two-dimensional array that covers at least a part of the front side 322A of the second module 320. In some implementations, the heat sinks 314 and 324 alternate in both planar axes, including x-axis and y-axis, when the first module 310 and the second module 320 are integrated in the electronic system 300.

Specifically, in some embodiments, at least one heat sink 324 is disposed in a gap between two heat sinks 314 along a certain planar axis (e.g., x-axis) that is substantially parallel to the first module 310 or the second module 320, and another heat sink 324 is disposed in a gap between another two heat sinks 314 on an alternative planar axis that is also substantially parallel to the first module 310 or the second module 320. In some embodiments, a subset of the heat sink 324 alternates with a subset of the heat sinks 314 along an alternative planar axis (i.e., y-axis) that is substantially parallel to the first or second substrate and perpendicular to the planar axis As explained above, when the heat sinks 314 and 324 are viewed in cross-section, they are disposed on two different substrates 312 and 314 which are shifted by a predetermined distance associated with a gap between the first and second modules. However, these heat sinks are still regarded as having alternating positions or being disposed in gaps between other heat sinks along the planar axis (x-axis), the alternative planer axis (y-axis), or both axes, when their projected locations on the corresponding axis (or axes) are so arranged as viewed from the side.

It is understood that the heat sink rows shown in FIGS. 2A-2D and the two-dimensional heat sink array shown in FIG. 3 are merely examples of heat sink configurations arranged for the purposes of mixing air and air flows between two closely placed electronic modules. Optionally, the heat sinks are distributed on a substrate of an electronic module according to other regular patterns (e.g., circles, rows that are titled by an angle with respect to the direction of the air flow, two-dimensional arrays that orient differently from those shown in FIG. 3, etc.). Optionally, the heat sinks are placed on a substrate of an electronic module according to irregular patterns, and particularly in some embodiments, according to the heat density on the corresponding substrate.

In particular, under some circumstances, the heat sinks on the same substrate do not adopt the same geometry sizes (e.g., length, width and thickness) and shapes, and these geometric parameters for each of them are individually determined to result in an enhanced air mixing and disturbance effect around the respective heat sink.

FIGS. 4A and 4B illustrate an exemplary electronic module 410 in which at least one electronic component 450 is monolithically integrated on a front side 402A and a back side 402B of its substrate 402 in accordance with some embodiments, respectively. The electronic component 450 is an integrated circuit chip integrated on the substrate 402 that is made of a certain substrate material, such as silicon. Specifically, in some embodiments, the electronic component 450 is manufactured on the substrate 402 by conventional microfabrication processes, including thin film deposition, photolithographic patterning, and chemical or physical etching. After the manufacturing of the electronic component 450 on the substrate 450, a heat sink 404 is mounted on the front side 402A of the substrate 402. In some embodiments, more than one heat sink could be micro-fabricated or micro-assembled together on the substrate 402 of the electronic component 450. As explained above, in various embodiments of the invention, the front side 402A of the substrate 402 is defined as the side having the heat sinks 404.

In some embodiments, the electronic component 450 is manufactured on the front side 402A, and the heat sink 404 is mounted on top of electronic component via a layer of adhesive material. In contract, in some other embodiments, the electronic component 450 is manufactured on the back side 402B, while the heat sink 404 is still mounted on the opposite side, e.g., the front side 402A. In some situations, the substrate 402 has a sufficiently high thermal conductivity to transfer the heat generated by the electronic component 450 to the heat sink 404. Optionally, in other situations, thermally conductive vias 406 are embedded within the substrate 402 to thermally couple the electronic component 450 and the heat sink 404 and to conduct the generated heat through the substrate 402.

One of skill in the art knows that when heat sinks are directly coupled to electronic dies or chips as shown in FIGS. 4A and 4B, the heat sinks arranged in an alternating configuration may be used to cool down multiple electronic chips or dies that are assembled in a three-dimensional (3D) micropackage. Typically, such a 3D micropackage has an extremely compact form factor and dissipates a large amount of heat. When the heat sinks are arranged in an alternating manner, they disturb and mix the air flow better and will increase the heat transfer efficiency.

FIGS. 4C and 4D illustrate an exemplary electronic module 420 in which at least one electronic component 450 is integrated on a front side 402A and a back side 402B of its substrate 402 in a hybrid manner. The electronic component 450 is a discrete integrated circuit chip that is mounted on the substrate 402, and the substrate 402 is optionally a silicon substrate or a printed circuit board (PCB). The electronic component 450 is manufactured by conventional microfabrication processes, but is assembled on the substrate 402 in a hybrid manner and becomes a part of an electronic module in an electronic system.

As shown in FIG. 4C, both the electronic component 450 and the heat sink 404 are mounted on the front side 402A of the substrate 402. The electronic component 450 is sandwiched between the front side 402A of the substrate 402 and the heat sink 404. In particular, the heat sink 404 is attached to the underlying electronic component 450 via a layer of adhesive material. In contrast, as shown in FIG. 4D, the electronic component 450 and the heat sink 404 are mounted on opposite sides, i.e., the back side 402B and the front side 402A, respectively. The heat sink is attached to the underlying front side 402A via a layer of adhesive material. In some embodiments, thermally conductive vias 406 are embedded within the substrate 402 to thermally couple the electronic component 450 on the back side 402B with the heat sink 404 on the front side 402A, conducting the heat generated by the electronic component 450 through the substrate 402.

FIG. 4E illustrates an exemplary electronic module 430 that includes a heat spreader 408 in accordance with some embodiments. The heat spreader 408 is integrated between the substrate 402 and the heat sink 404, to spread the heat transferred from the electronic component 450 evenly to the heat sink 404. Typically, the heat spreader 408 has a large heat conductivity coefficient, such that it spreads the heat substantially evenly.

The heat sink 404 is attached to the heat spreader 408 via a layer of adhesive material. As shown in FIG. 4E, in some embodiments, the heat spreader 408 is mounted on the electronic component 450 that is integrated on the front side 402A of the substrate 402. However, from another perspective not reflected in FIG. 4E, the heat spreader 408 is mounted onto the front side 402A of the substrate 402 directly, but coupled by thermal vias embedded within the substrate 402 to the electronic component 450 that is disposed elsewhere on the substrate 402.

It should be understood that FIGS. 4A-4E are used to illustrate relative positions among the electronic component 450, the substrate 402, the heat sink 404, and the heat spreader 408 for each heat sink in FIGS. 2A-2D and 3. One of skill in the art will appreciate that more than one electronic component 450 may replace the illustrated electronic component 450 and that more than one heat sink 404 may replace the illustrated heat sink 404.

FIGS. 5A-5C illustrate exemplary heat sinks 510, 520 and 530 that have different geometrical shapes in accordance with some embodiments. Each heat sink 510, 520 or 530 represents one heat sink in FIGS. 2A-2D and 3. In some implementations, the heat sink 510 has a conventional shape, e.g., a rectangular block. In some implementations, the heat sink 520 is based on the conventional rectangular block, but has rounded corners and edges to control air flow around the heat sink 520. Optionally, in various embodiments of the invention, the heat sink also adopts other regular shapes, such as a water drop shape, a cylinder and a ball.

Further, in some implementations, the heat sink 530 has a finned or corrugated surface to increase the effective heat dissipation surface area of the heat sink 530. When a corresponding electronic module that includes the heat sink 530 is integrated with another electronic module, the finned or corrugated surface faces towards an air gap that separates the two electronic modules.

Figure 6:
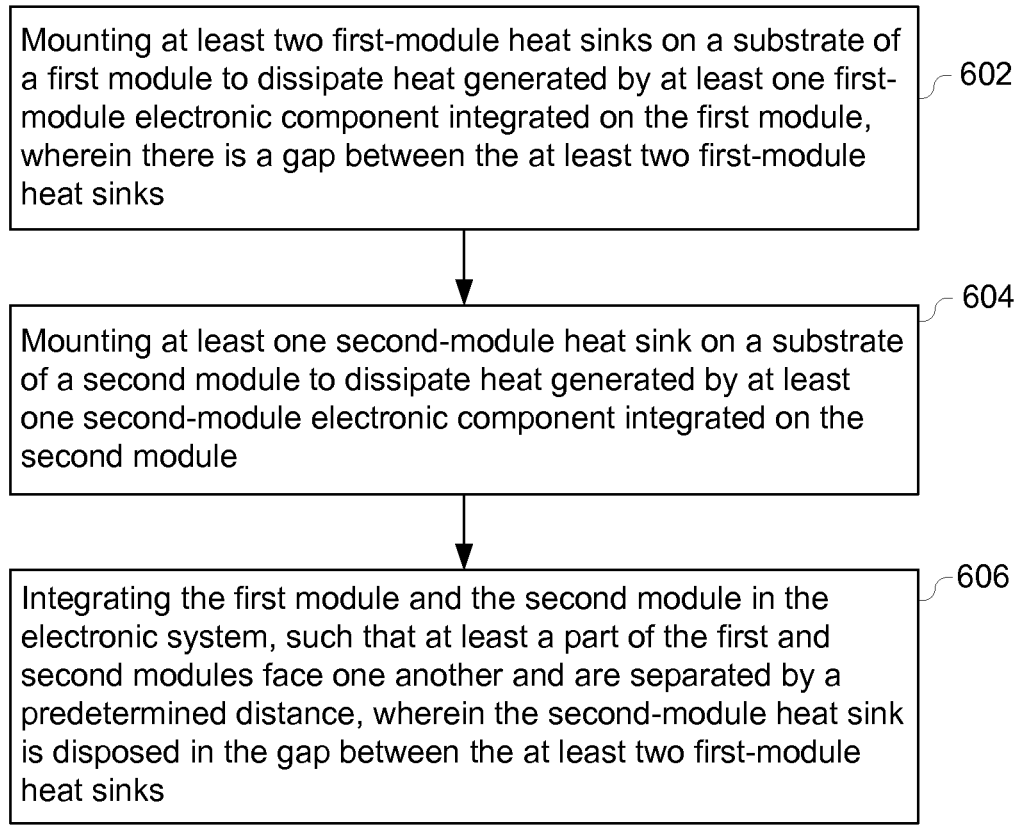
FIG. 6 illustrates an exemplary flow chart of a method for assembling an electronic system and managing heat flow for the purpose of dissipating heat generated from the electronic system in accordance with some embodiments.

FIG. 6 illustrates an exemplary flow chart of a method 600 for assembling an electronic system and managing heat flow for the purpose of dissipating heat generated from the electronic system in accordance with some embodiments. At least two first-module heat sinks are mounted (602) on a front side of a first module to dissipate heat generated by at least one first-module electronic component integrated on the first module, and there is a gap formed between the at least two first-module heat sinks. At least one second-module heat sink is mounted (604) is mounted on a front side of a second module to dissipate heat generated by at least one second-module electronic component integrated on the second module. The first module and the second module are then integrated (606) in an electronic system. In accordance with the integrating, at least a part of the front sides of the first and second modules face one another and are separated by a predetermined distance, and the second-module heat sink is disposed in the gap between the at least two first-module heat sinks.

In some implementations, the first module comprises a plurality of first heat sinks including the at least two first-module heat sinks, and the second module comprises a plurality of second heat sinks including at least the one second-module heat sink. After the integrating, the plurality of second heat sinks alternate with the plurality of first heat sinks along the planar axis, such that the at least one second-module heat sink is disposed in a gap between the at least two first-module heat sinks.

Further in accordance with the alternating heat sink configuration, the respective number of heat sinks in the first or second module, and the geometric features (e.g., configurations, locations, sizes, shapes, etc.) of each individual heat sink are engineered, individually or together, for the purpose of disturbing and mixing air flow that passes an air channel between the first and second modules. More details and examples for arranging the heat sinks according to the alternating configurations are explained above with reference to FIGS. 2A-2D, 3, 4A-4E and 5A-5C.

As a specific example, the electronic system is a memory system that is commonly integrated in many computers and consumer electronic devices. Typically, memory modules are inserted into closely spaced memory slots on a circuit board, such as a motherboard. Upon insertion, the memory modules are assembled substantially in parallel on the circuit board. On each memory module, packaged memory components are assembled on the respective substrate. At least two heat sinks and at least one heat sink are disposed on a respective front side of two memory modules, and thermally coupled to the respective memory components in the two memory modules. When the memory system is integrated with the two memory modules facing one another, the at least two heat sinks alternate with the at least one heat sink at least along the planar axis to disturb and mix air flow.

Such an alternating heat sink configuration improves the efficiency for heat dissipation even when the space between the two memory modules and the rate of the air flow remain unchanged. As the heat dissipated by memory components increases, existing solutions may have to use a fan that has a higher rotational speed to increase the rate of the air flow. Alternatively, some memory slots have to be left open to expand the predetermined distance between the memory modules. In contrast, the alternating heat sink configuration creates more turbulent air flow and obtains an enhanced cooling effect thereby, and therefore, can accommodate more heat dissipation from the memory modules, before a higher rate air flow or an extra distance between the memory modules are adopted.

Under some circumstances, when the heat sinks are rearranged according to an alternating configuration, device temperatures of the electronic components are reduced up to ten degrees, even if the other conditions (e.g., the distance between the electronic modules, substrate areas by the heat sinks, the rotational speed of the fan, etc.) remain the same.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. An electronic system, comprising:
   a first module comprising:
      at least one first-module electronic component;
      at least two first-module heat sinks thermally coupled to the at least one first-module electronic component, wherein there is a gap between the at least two first-module heat sinks;
   a second module comprising:
      at least one second-module electronic component; and
      at least one second-module heat sink thermally coupled to the at least one second-module electronic component,
   wherein the first and second modules are separated from each other by a predetermined distance such that the second-module heat sink is disposed in the gap between the at least two first-module heat sinks.

2. The electronic system of claim 1, wherein the first module is a first memory module comprising a first-module substrate, and the at least one first-module electronic component is a memory integrated circuit coupled on the first-module substrate, and
   wherein the second module is a second memory module comprising a second-module substrate, and the at least one second-module electronic component is a memory integrated circuit coupled on the second-module substrate.

3. The electronic system of claim 1, wherein the at least two first-module heat sinks and the at least one second-module heat sink are configured for mixing air and air flow between the first module and the second module.

4. The electronic system of claim 1, wherein the first module comprises a plurality of first-module heat sinks including the at least two first-module heat sinks, and the second module comprises a plurality of second-module heat sinks including the at least one second-module heat sink, and wherein the plurality of second-module heat sinks alternate with the plurality of first-module heat sinks, such that each of the plurality of second-module heat sinks is disposed in a respective gap between two of the plurality of first-module heat sinks.

5. The electronic system of claim 1, wherein the at least two first-module heat sinks have a first thickness, and the at least one second-module heat sink has a second thickness, a sum of the first and second thicknesses being smaller than the predetermined distance.

6. The electronic system of claim 1, wherein the at least two first-module heat sinks and the at least one second-module heat sink have a combined length along a planar axis that is substantially parallel to the first module and the second module, wherein the combined length is less than a length of the first module or the second module along the planar axis.

7. The electronic system of claim 6, wherein the combined length is selected from a group of one third, one quarter and one tenth of the length of the first module or the second module.

8. The electronic system of claim 1, wherein along an alternative planar axis that is substantially parallel to the first module and the second module, at least one heat sink among the at least two first-module heat sinks and the at least one second-module heat sink extends to cover more than half of the module width of the respective module along the alternative planar axis.

9. The electronic system of claim 8, wherein along the alternative planar axis, a subset of the at least two first-module heat sinks extend beyond the edges of a substrate of the first module, and are physically coupled to one another at their extended ends.

10. The electronic system of claim 1, wherein a heat spreader that has a substantially high thermal conductivity is disposed beneath each of the at least two first-module heat sinks to evenly spread heat dissipated from the at least one first-module electronic component.

11. The electronic system of claim 1, wherein the at least two first-module heat sinks or the at least one second-module heat sink comprises a two-dimensional array of heat sinks covering at least a part of the substrate of the respective module.

12. The electronic system of claim 11, wherein the second-module heat sink is disposed in the gap between the at least two first-module heat sinks along a planar axis that is substantially parallel to the first module or the second module, and a subset of the at least one second-module heat sink alternates with a subset of the at least two first-module heat sinks along an alternative planar axis that is substantially parallel to the first or second substrate and perpendicular to the planar axis.

13. The electronic system of claim 1, wherein the at least one first-module electronic component is coupled between the at least two first-module heat sinks and the substrate of the first module.

14. The electronic system of claim 1, wherein the at least one first-module electronic component is monolithically integrated on a front side or a back side of the first module.

15. The electronic system of claim 1, wherein the at least one first-module electronic component is mounted on a back side of the first module, and heat generated by the at least one first-module electronic component is conducted via the substrate of the first module to the at least two first-module heat sinks that are coupled on a front side of the first module.

16. The electronic system of claim 1, wherein at least one heat sink of the at least two first-module heat sinks and the at least one second-module heat sink has rounded corners and edges to control air flow between the first and second modules.

17. The electronic system of claim 1, wherein at least one heat sink of the at least two first-module heat sinks and the at least one second-module heat sink has a finned surface facing towards a separation gap between the first and second modules.

18. The electronic system of claim 1, wherein the at least two first-module heat sinks are physically coupled together by a bridging heat sink structure that has a smaller thickness than the respective thickness of the at least two first-module heat sinks.

19. The electronic system of claim 1, wherein a layer of thermally conductive material is applied to couple the at least two first-module heat sinks and the at least one second-module heat sink to their respective electronic component or to their respective module.

20. A memory system, comprising:
   a first memory module comprising:
      at least one first-module memory component;

at least two first-module heat sinks thermally coupled to the at least one first-module memory component, wherein there is a gap between the at least two first-module heat sinks;
a second memory module comprising:
at least one second-module memory component; and
at least one second-module heat sink thermally coupled to the at least one second-module memory component,
wherein the first and second memory modules are separated from each other by a predetermined distance such that the second-module heat sink is disposed in the gap between the at least two first-module heat sinks.

21. A method of dissipating heat in an electronic system, comprising:
mounting at least two first-module heat sinks on a substrate of a first module to dissipate heat generated by at least one first-module electronic component integrated on the first module, wherein there is a gap between the at least two first-module heat sinks;
mounting at least one second-module heat sink on a substrate of a second module to dissipate heat generated by at least one second-module electronic component integrated on the second module; and
integrating the first module and the second module in the electronic system, such that at least a part of the first and second modules face one another and are separated by a predetermined distance, wherein the second-module heat sink is disposed in the gap between the at least two first-module heat sinks.

22. An electronic system, comprising:
a first module comprising:
a first-module front side;
at least one first-module electronic component;
at least two first-module heat sinks disposed at the first-module front side and thermally coupled to the at least one first-module electronic component;
a second module comprising:
a second-module front side that faces the first-module front side and is separated there from by a gap having a predetermined distance;
at least one second-module electronic component; and
at least one second-module heat sink disposed at the second-module front side and thermally coupled to the at least one second-module electronic component,
wherein the at least one second-module heat sink is disposed in the gap between the at least two first-module heat sinks.

* * * * *

UNITED STATES PATENT AND TRADEMARK OFFICE
CERTIFICATE OF CORRECTION

PATENT NO.        : 9,158,349 B2                                    Page 1 of 1
APPLICATION NO.   : 14/135223
DATED             : October 13, 2015
INVENTOR(S)       : Dean et al.

It is certified that error appears in the above-identified patent and that said Letters Patent is hereby corrected as shown below:

In the claims, claim 22, column 18, line 16, please delete "separated there from by" and insert --separated by--.

Signed and Sealed this
Twenty-second Day of March, 2016

Michelle K. Lee
*Director of the United States Patent and Trademark Office*